(12) United States Patent
Akahane

(10) Patent No.: US 11,201,536 B2
(45) Date of Patent: Dec. 14, 2021

(54) SWITCHING CONTROL CIRCUIT AND SEMICONDUCTOR DEVICE

(71) Applicant: FUJI ELECTRIC CO., LTD., Kawasaki (JP)

(72) Inventor: Masashi Akahane, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 17/033,130

(22) Filed: Sep. 25, 2020

(65) Prior Publication Data
US 2021/0152075 A1 May 20, 2021

(30) Foreign Application Priority Data

Nov. 15, 2019 (JP) .............................. JP2019-206975
May 26, 2020 (JP) .............................. JP2020-091592

(51) Int. Cl.
*H02M 1/08* (2006.01)
*H02M 1/088* (2006.01)
*H02M 3/158* (2006.01)
*H03K 19/0185* (2006.01)

(52) U.S. Cl.
CPC ........... *H02M 1/088* (2013.01); *H02M 3/158* (2013.01); *H03K 19/018521* (2013.01)

(58) Field of Classification Search
None
See application file for complete search history.

(56) References Cited

U.S. PATENT DOCUMENTS

| 8,253,472 | B2 * | 8/2012 | Nishijima | ...... | H03K 19/018521 |
| | | | | | 327/333 |
| 9,325,317 | B2 * | 4/2016 | Akahane | ................ | H03K 17/26 |
| 10,374,592 | B2 * | 8/2019 | Akahane | ................ | H02M 1/08 |
| 10,804,893 | B2 * | 10/2020 | Akahane | ................ | H03K 3/356 |

FOREIGN PATENT DOCUMENTS

| JP | S63-93786 U | 6/1988 |
| JP | 2005-175454 A | 6/2005 |
| JP | 2006-159472 A | 6/2006 |
| JP | 2013-048390 A | 3/2013 |

* cited by examiner

*Primary Examiner* — Jeffery S Zweizig
(74) *Attorney, Agent, or Firm* — Rabin & Berdo, P.C.

(57) ABSTRACT

A semiconductor device having a first switching device and a second switching device respectively on a power supply side and a ground side of the semiconductor device, for driving a load of the semiconductor device, and a switching control circuit that controls switching of the first and second switching devices. The switching control circuit includes a signal output circuit that outputs a set signal and a reset signal for turning on and off the first switching device, respectively, in response to an input signal of the semiconductor device, a level shift circuit that shifts a level of each of the set and reset signals, a drive circuit that drives the first switching device in response to an output from the level shift circuit, and a power supply circuit including a plurality of transistors that are Darlington-coupled, and are configured to generate a power supply voltage of the signal output circuit.

17 Claims, 9 Drawing Sheets

SWITCHING CONTROL CIRCUIT AND SEMICONDUCTOR DEVICE

CROSS-REFERENCE TO RELATED APPLICATION

The present application claims priority pursuant to 35 U.S.C. § 119 from Japanese patent application numbers 2019-206975 and 2020-091592, filed on Nov. 15, 2019 and May 26, 2020, respectively, the entire disclosure of which is hereby incorporated by reference herein.

BACKGROUND

Technical Field

The present disclosure relates to a switching control circuit and a semiconductor device.

Description of the Related Art

There is a half-bridge circuit, which includes a high-side switching device and a low-side switching device and drives a load (for example, Japanese Patent Application Publication No. 2013-48390).

Meanwhile, when the low-side switching device is turned on, a negative voltage may be generated at the node at which the high-side switching device and the low-side switching device are coupled, due to the effects of the load, wiring, and/or the like. When such a negative voltage is generated, the output of the power supply circuit for operating various circuits of the switching control circuit significantly decreases, which causes the operation of the switching control circuit to be unstable.

The present disclosure has been achieved in light of such an issue as described above, and an object thereof is to provide a switching control circuit that stably operates.

SUMMARY

A first aspect of the present disclosure for solving an issue described above is a switching control circuit for a semiconductor device having a first switching device on a power supply side thereof, and a second switching device on a ground side thereof, the second switching device driving a load of the semiconductor device in cooperation with the first switching device, the switching control circuit controlling switching of the first and second switching devices, and comprising: a signal output circuit that outputs a set signal for turning on the first switching device and a reset signal for turning off the first switching device, in response to an input signal of the switching control circuit; a level shift circuit that shifts a level of each of the set signal and the reset signal; a first drive circuit that drives the first switching device in response to an output from the level shift circuit; and a power supply circuit including a plurality of transistors that are Darlington-coupled, the plurality of Darlington-coupled transistors being configured to generate a power supply voltage for the signal output circuit.

In addition, a second aspect of the present disclosure is a semiconductor device having a load, comprising: a first switching device on a power supply side of the semiconductor device; a second switching device on a ground side of the semiconductor device, the second switching device driving the load of the semiconductor device in cooperation with the first switching device; and a switching control circuit that controls switching of the first and second switching devices, the switching control circuit including: a signal output circuit that outputs a set signal for turning on the first switching device and a reset signal for turning off the first switching device, in response to an input signal of the semiconductor device; a level shift circuit that shifts a level of each of the set signal and the reset signal; a drive circuit that drives the first switching device in response to an output from the level shift circuit; and a power supply circuit including a plurality of transistors that are Darlington-coupled, the plurality of Darlington-coupled transistors being configured to generate a power supply voltage for the signal output circuit.

According to the present disclosure, it is possible to provide a switching control circuit that stably operates.

BRIEF DESCRIPTION OF THE DRAWINGS

FIG. 6 is a diagram illustrating an example of a power supply circuit 40a.

FIG. 8 is a diagram illustrating examples of outputs of the power supply circuits 40a, 40b when an IGBT 31 is turned on.

DETAILED DESCRIPTION

At least the following matters will become apparent from the description of the present specification and the accompanying drawings.

Embodiments

Figure 1:
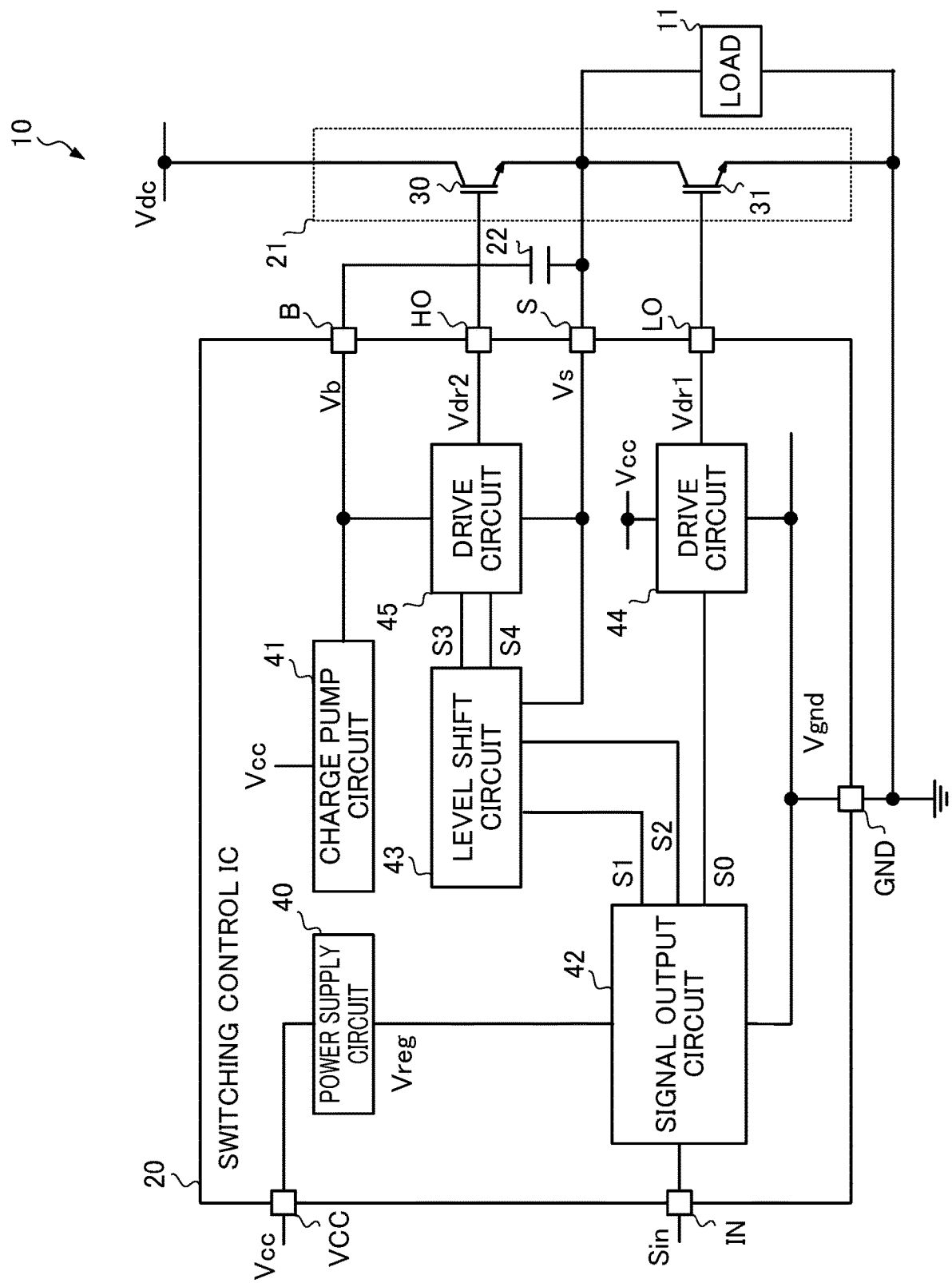
FIG. 1 is a diagram illustrating an example of a power module 10.

FIG. 1 is a diagram illustrating the configuration of a power module 10 according to an embodiment of the present disclosure. The power module 10 is a semiconductor device that drives a load 11 in response to an instruction from a microcomputer (not shown), and includes a switching control Integrated Circuit (IC) 20, a half-bridge circuit 21, and a capacitor 22.

The switching control IC 20 is a high voltage integrated circuit (HVIC: High Voltage IC) that controls the operation of the half-bridge circuit 21 in response to an input signal Sin from the microcomputer (not shown). Although the detail of the switching control IC 20 will be described later, the switching control IC 20 has terminals VCC, IN, GND, B, S, HO, and LO.

The half-bridge circuit 21 drives a motor coil of an air conditioner, which is the load 11, for example, and includes an Insulated Gate Bipolar Transistor (IGBT) 30 and an IGBT 31.

The IGBT 30 is a high-side switching device, and has a gate electrode coupled to the terminal HO, an emitter electrode coupled to the terminal S, and a collector electrode to which a predetermined voltage Vdc (for example, "400 V") is applied.

The IGBT 31 is a low-side switching device, and has a gate electrode coupled to the terminal LO, a collector electrode coupled to the terminal S, and an emitter electrode that is grounded.

Note that, in an embodiment of the present disclosure, the IGBT is used for such a switching device, however, for example, a MOS transistor or a bipolar transistor may be used instead. In addition, the IGBT 30 corresponds to a "first switching device on a power supply side", and the IGBT 31 corresponds to a "second switching device on a ground side".

The capacitor 22 has one end coupled to the terminal B and the other end coupled to the terminal S. The capacitor 22 is charged with a bootstrap voltage Vb from a charge pump circuit 41, which will be described later, being applied to the terminal B. As a result, the bootstrap voltage Vb is generated across the capacitor 22. Note that the bootstrap voltage Vb is used to turn on the high-side IGBT 30.

For example, in the case where the voltage Vs at the terminal S is "0 V", when the voltage at the gate electrode of the IGBT 30 exceeds a threshold voltage of the IGBT 30, the IGBT 30 is turned on. However, when the IGBT 30 is turned on, the voltage Vs at the terminal S approaches the voltage Vdc (for example, "400 V"). Thus, in order to keep the IGBT 30 on, it is necessary to drive the IGBT 30 with reference to the voltage Vs at the terminal S coupled with the emitter electrode of the IGBT 30.

In an embodiment of the present disclosure, with reference to the voltage Vs at the terminal S, a voltage that is higher than the voltage Vs by the bootstrap voltage Vb is generated at the terminal B. Hence, although the detail will be described later, the switching control IC 20 can turn on the IGBT 30 using the bootstrap voltage Vb.

<<<Configuration of Switching Control IC 20>>>

The switching control IC 20 includes a power supply circuit 40, the charge pump circuit 41, a signal output circuit 42, a level shift circuit 43, and drive circuits 44, 45.

The power supply circuit 40 generates a power supply voltage Vreg to be used inside the switching control IC 20, based on a power supply voltage Vcc (for example, "20 V") applied to the terminal VCC. Note that although the detail will be described later, the power supply circuit 40 according to an embodiment of the present disclosure is configured to be able to generate a stable power supply voltage Vreg even when the IGBT 31 is turned on.

The charge pump circuit 41 generates the bootstrap voltage Vb to be used to charge the capacitor 22, based on the power supply voltage Vcc, for example.

The signal output circuit 42 outputs signals for controlling the switching of the IGBTs 30, 31 in response to an input signal Sin having a logic level inputted through the terminal IN. Specifically, the signal output circuit 42 outputs a set pulse signal S1 for turning on the high-side IGBT 30, a reset pulse signal S2 for turning off the IGBT 30, and a control signal S0 for controlling the switching of the low-side IGBT 31, in response to the input signal Sin.

Figure 2:
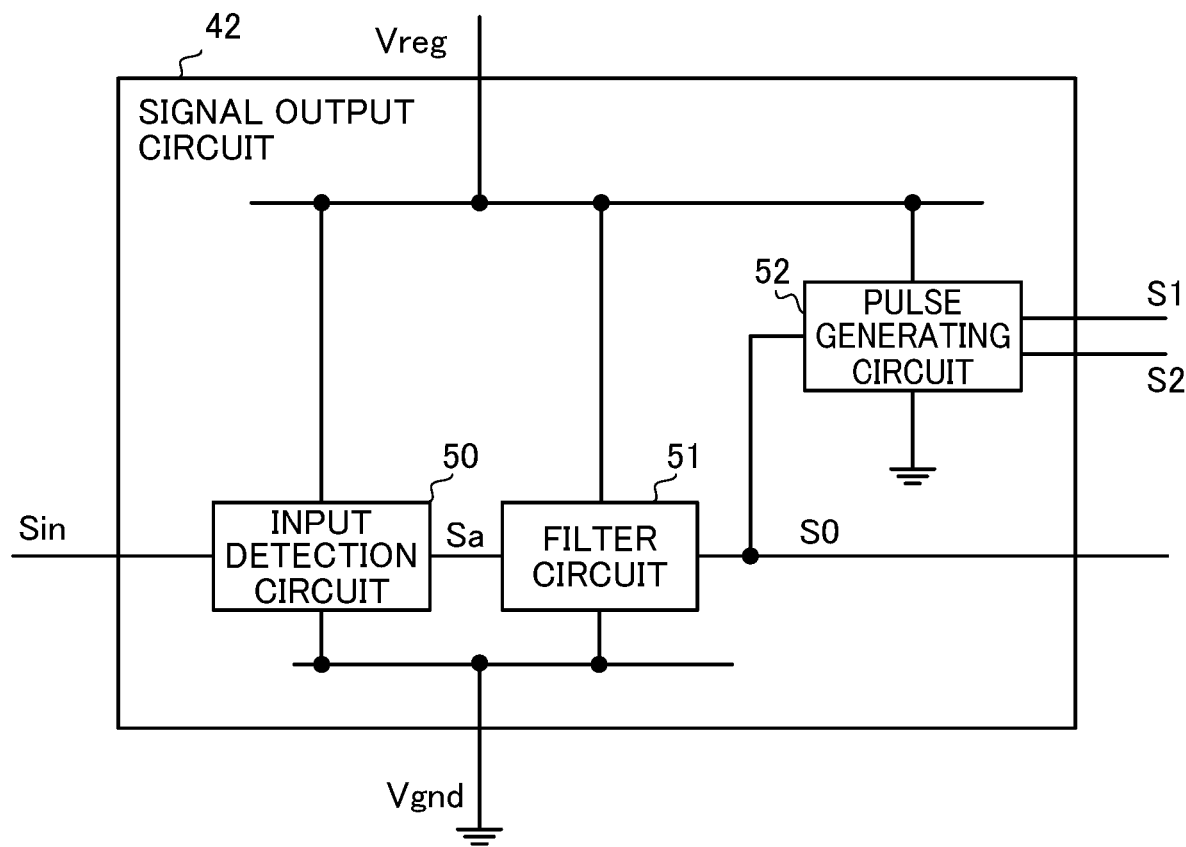
FIG. 2 is a diagram illustrating an example of a signal output circuit 42.

As illustrated in FIG. 2, the signal output circuit 42 includes an input detection circuit 50, a filter circuit 51, and a pulse generating circuit 52. Note that the input detection circuit 50, the filter circuit 51, and the pulse generating circuit 52 operate based on the power supply voltage Vreg of the power supply circuit 40 with reference to the ground voltage Vgnd. Accordingly, the node for grounding of each of the input detection circuit 50, the filter circuit 51, and the pulse generating circuit 52 is coupled to the terminal GND to be grounded.

The input detection circuit 50 detects the level of the input signal Sin and outputs a signal Sa having the same logic level as the logic level of the input signal Sin. Specifically, when the input signal Sin becomes a high level (hereinafter referred to as high or high level), the input detection circuit 50 outputs a high signal Sa, and when the input signal Sin becomes a low level (hereinafter referred to as low or low level), the input detection circuit 50 outputs a low signal Sa. Note that the input detection circuit 50 includes, for example, a comparator (not shown).

The filter circuit 51 is a low-pass filter that removes a high-frequency noise in the signal Sa, and includes, for example, an operational amplifier (not shown) and the like. The filter circuit 51 according to an embodiment of the present disclosure outputs the signal Sa from which the noise has been removed as the control signal S0.

The pulse generating circuit 52 outputs the set pulse signal S1 and the reset pulse signal S2 based on the change point of the control signal S0. Specifically, when the control signal S0 changes from low to high, the pulse generating circuit 52 outputs a high set pulse signal S1, and when the control signal S0 changes from high to low, the pulse generating circuit 52 outputs a high reset pulse signal S2. Note that each of the set pulse signal S1 and the reset pulse signal S2 according to an embodiment of the present disclosure is a pulse signal having an amplitude level that changes between 0 V and the level (for example, 5 V) of the power supply voltage Vreg.

The level shift circuit 43 shifts the level of each of the set pulse signal S1 and the reset pulse signal S2 to a level at which the logic circuit (described later) of the drive circuit 45 is operable. Specifically, the level shift circuit 43 shifts the level of the set pulse signal S1 and outputs a set pulse signal S3 having an amplitude level of several tens of volts with reference to the voltage Vs, which serves as a high-side reference voltage, for example. In addition, the level shift circuit 43 shifts the level of the reset pulse signal S2 and outputs a reset pulse signal S4 having an amplitude level of several tens of volts with reference to the voltage Vs, for example.

The drive circuit 44 drives the low-side IGBT 31 in response to the control signal S0. Specifically, the drive circuit 44 outputs a high drive signal Vdr1 to the gate electrode of the IGBT 31 through the terminal LO in response to the low control signal S0. As a result, the IGBT 31 is turned on. On the other hand, the drive circuit 44 outputs a low drive signal Vdr1 to the gate electrode of the IGBT 31 through the terminal LO in response to the high control signal S0. As a result, the IGBT 31 is turned off. Note that the drive circuit 44 operates based on the power supply voltage Vcc.

Figure 3:
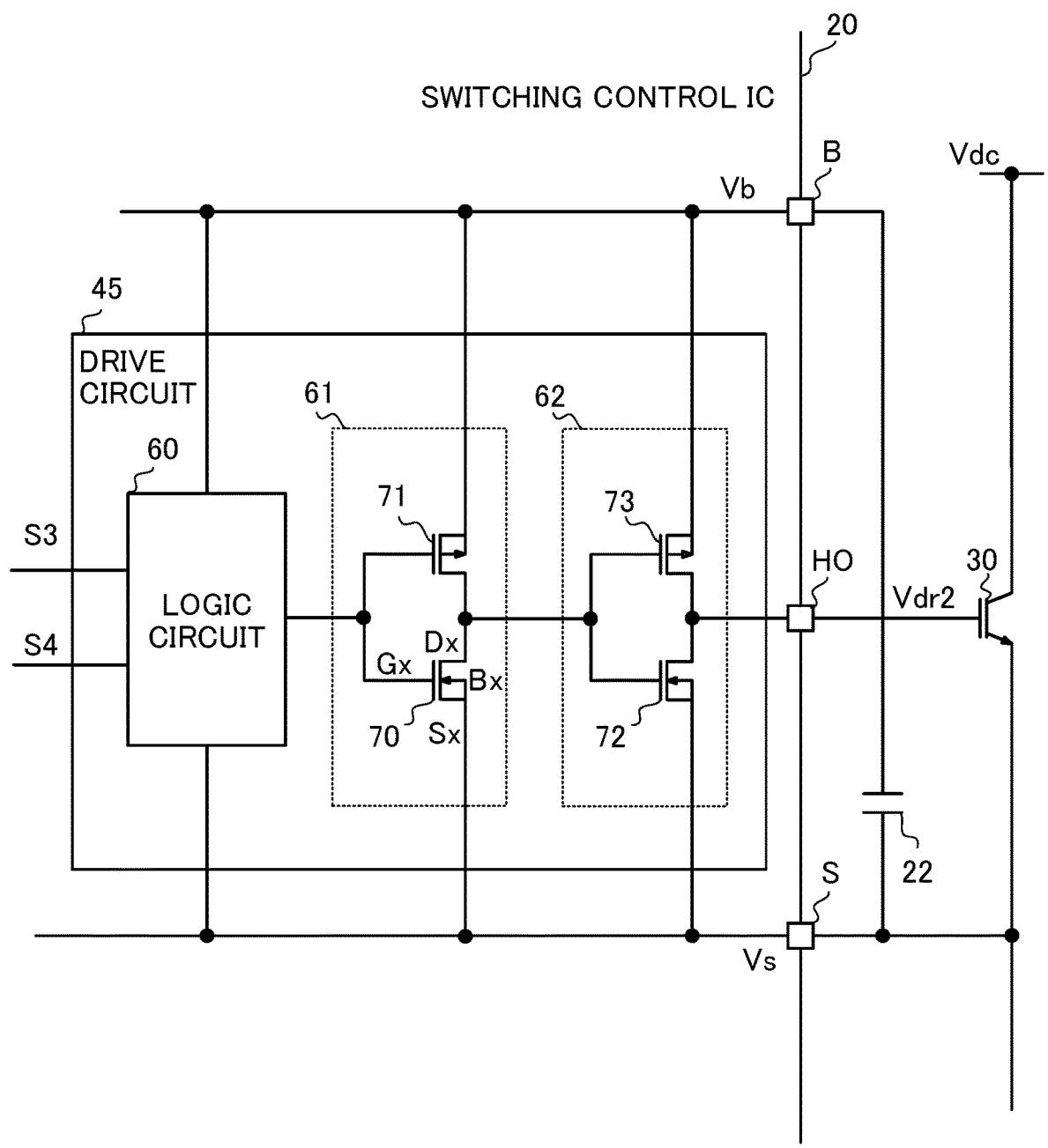
FIG. 3 is a diagram illustrating an example of a drive circuit 45.

The drive circuit 45 turns on the high-side IGBT 30 in response to the set pulse signal S3 and turns off the IGBT 30 in response to the reset pulse signal S4. FIG. 3 is a diagram illustrating an example of the drive circuit 45. The drive circuit 45 includes a logic circuit 60 and inverters 61, 62.

The logic circuit 60 outputs a high signal when the set pulse signal S1 is inputted and outputs a low signal when the reset pulse signal S2 is inputted. Note that the logic circuit 60 includes, for example, a MOS transistor and a latch circuit not shown.

The inverter 61 is a circuit that inverts the logic level of the signal from the logic circuit 60 and outputs the inverted signal, and includes an NMOS (n-type metal-oxide-semiconductor) transistor 70 and a PMOS (p-type metal-oxide-semiconductor) transistor 71.

The inverter 62 is a circuit that inverts the logic level of the signal from the inverter 61 and outputs the inverted signal as a drive signal Vdr2, and includes an NMOS transistor 72 and a PMOS transistor 73.

Hence, when the set pulse signal S1 is inputted, the drive circuit 45 outputs the high drive signal Vdr2 to the gate electrode of the IGBT 30 through the terminal HO. On the other hand, when the reset pulse signal S2 is inputted, the drive circuit 45 outputs the low drive signal Vdr2 to the gate electrode of the IGBT 30 through the terminal HO.

Here, the drive signal Vdr2 is a signal whose logic level changes with reference to the voltage Vs at the terminal S. Hence, the IGBT 30 is turned on in response to the high drive signal Vdr2 and is turned off in response to the low drive signal Vdr2. Note that the drive circuit 44 corresponds to a "second drive circuit" and the drive circuit 45 corresponds to a "first drive circuit". In addition, the set pulse signal S1 corresponds to a "set signal" and the reset pulse signal S2 corresponds to a "reset signal".

<<<Operation of Switching Control IC 20>>>

Figure 4:
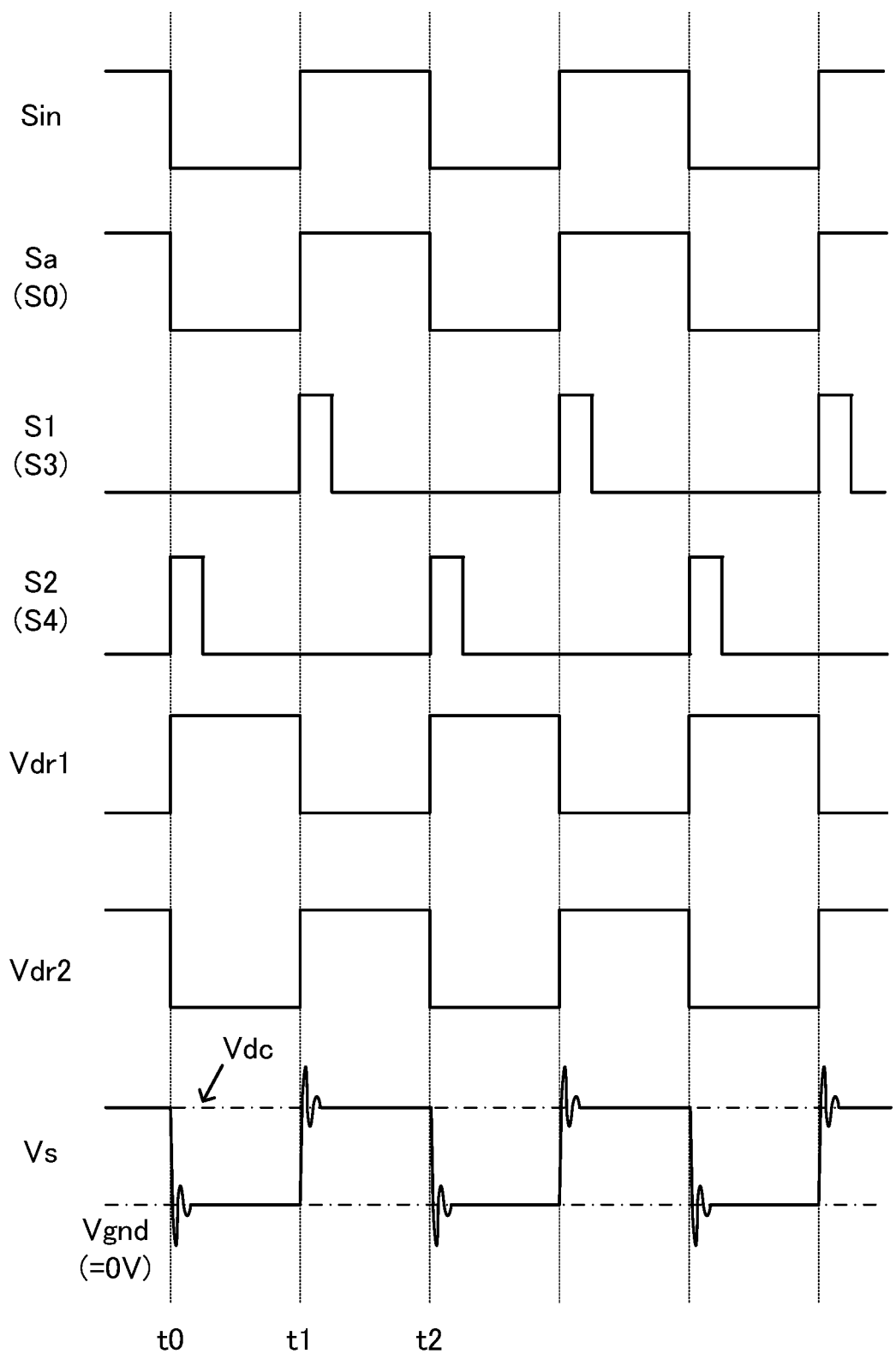
FIG. 4 is a diagram for explaining an operation of a switching control IC 20.

FIG. 4 is a diagram for explaining the operation of the switching control IC 20. It is assumed that the delay time of the signal in the signal output circuit 42 is designed to be sufficiently short in an embodiment of the present disclosure.

First, when the input signal Sin goes low at time t0, the input detection circuit 50 in FIG. 2 also outputs the low signal Sa. The filter circuit 51 removes the noise (not shown) of the signal Sa and outputs the control signal S0 having the same logic level as the logic level of the signal Sa.

In addition, when the control signal S0 goes low, the pulse generating circuit 52 outputs the high reset pulse signal S2. As a result, the high reset pulse signal S4 whose level has been shifted is outputted from the level shift circuit 43.

The low-side drive circuit 44 changes the drive signal Vdr1 to high in response to the low control signal S0, and the high-side drive circuit 45 changes the drive signal Vdr2 to low in response to the high reset pulse signal S4.

As a result, the IGBT 30 is turned off and the IGBT 31 is turned on, and thus the voltage Vs drops from the voltage Vdc (for example, "400 V") to the voltage Vgnd (here, "0 V"). Meanwhile, as described above, wiring for supplying power to the load 11 is provided between the terminal S and the load 11. In addition, the load 11 is, for example, a motor coil having a large inductance value. Thus, when the IGBT 31 is turned on, ringing occurs in the voltage Vs, and the voltage Vs results in a negative voltage smaller than the voltage Vgnd.

In addition, when the input signal Sin goes high at time t1, the input detection circuit 50 also outputs the high signal Sa. The filter circuit 51 removes the noise (not shown) of the signal Sa and outputs the control signal S0 having the same logic level as the logic level of the signal Sa.

In addition, when the control signal S0 goes high, the pulse generating circuit 52 outputs the high set pulse signal S1. As a result, the high set pulse signal S3 whose level has been shifted is outputted from the level shift circuit 43.

The low-side drive circuit 44 changes the drive signal Vdr1 to low in response to the high control signal S0, and the high-side drive circuit 45 changes the drive signal Vdr2 to high in response to the high set pulse signal S3.

As a result, the IGBT 30 is turned on and the IGBT 31 is turned off, and thus the voltage Vs rises from the voltage Vgnd (here, "0 V") to the voltage Vdv (for example, "400 V"). As described above, since the load 11 is coupled to the terminal S through the wiring, when the IGBT 30 is turned on, ringing occurs in the voltage Vs, and the voltage Vs results in a voltage larger than the voltage Vdc. Note that at time t2 and thereafter, the operation from the time t0 to the time t1 is repeated.

<<<Semiconductor Substrate 100>>>

As described above, in an embodiment of the present disclosure, when the IGBT 31 is turned on, the voltage Vs drops below the voltage Vgnd resulting in a negative voltage ("Vs"<"0 V"). When the voltage Vs becomes a negative voltage, a "leakage current" flows from the GND terminal to the terminal S through a semiconductor substrate in which the switching control IC 20 is formed.

Figure 5:
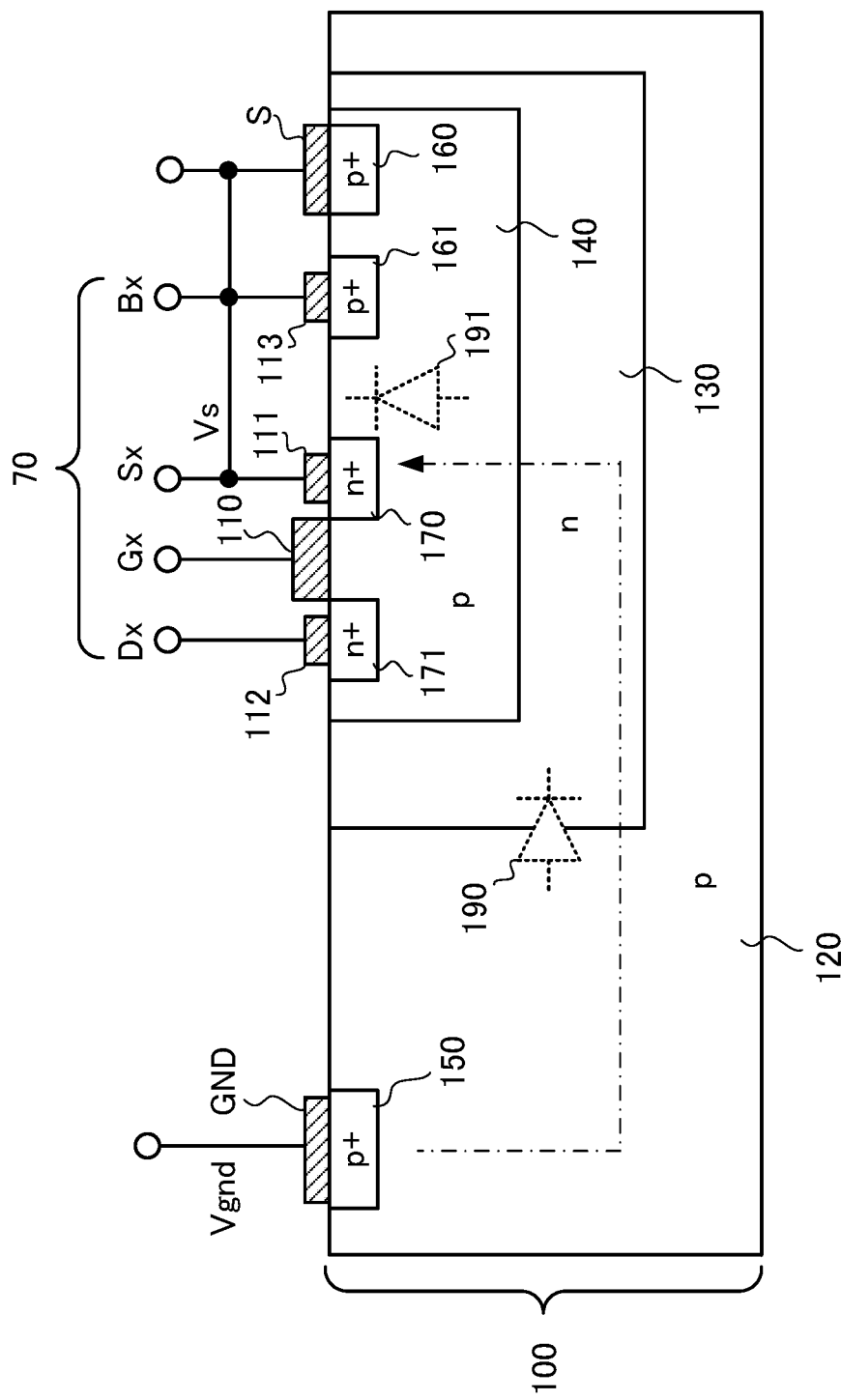
FIG. 5 is a diagram illustrating an example of a semiconductor device 100 in which the switching control IC 20 is formed.

FIG. 5 is a diagram for explaining a semiconductor substrate 100 in which the switching control IC 20 is formed. Note that, in FIG. 5, among circuits and terminals of the switching control IC 20, only the configurations of those needs for explaining the "leakage current" are illustrated for convenience. Specifically, FIG. 5 illustrates the terminals GND, S and the NMOS transistor 70 of the high-side drive circuit 45.

The semiconductor substrate 100 is, for example, a p-type substrate made of silicon, and the terminals GND, S and a gate electrode 110, a source electrode 111, and a drain electrode 112, and a body electrode 113 of the NMOS transistor 70 are formed on the front side of the semiconductor substrate 100.

Here, the terminals GND, S and the electrodes of the NMOS transistor 70 are made of, for example, a conductive material such as polysilicon or the like and/or a metal electrode.

In addition, the electrodes of the NMOS transistor 70 are denoted by signs that are different between FIG. 3 and FIG. 5, for convenience. However, the gate electrode 110 of the NMOS transistor 70 corresponds to a "gate electrode Gx", the source electrode 111 corresponds to a "source electrode Sx", the drain electrode 112 corresponds to a "drain electrode Dx", and the body electrode 113 corresponds to a "body electrode Bx".

In the interior of the semiconductor substrate 100, a semiconductor region 120 formed using the semiconductor substrate 100, a p-type well region 140, an n-type well region 130, $p^+$-type contact regions 150, 160, 161, an $n^+$-type source region 170, and an $n^+$-type drain region 171 are formed. Note that $n^+$-type or $p^+$-type described hereinafter means that the doping concentration thereof is higher than that of n-type or p-type.

The well region 130 and the contact region 150 are formed on the front surface side in the semiconductor region 120, and the terminal GND is formed on the front surface of the contact region 150.

The well region 130 is a region containing an n-type impurity such as phosphorous and/or the like, and the p-type well region 140 is formed on the front surface side in the well region 130.

The well region 140 is a region containing a p-type impurity, and the contact regions 160, 161, the source region 170, and the drain region 171 are formed on the front surface side in the well region 140.

The terminal S is formed in the contact region 160 and the body electrode 113 ("Bx") of the NMOS transistor 70 is formed in the contact region 161.

In addition, the source electrode 111 ("Sx") is formed in the source region 170, and the drain electrode 112 ("Dx") is formed in the drain region 171. The gate electrode 110 ("Gx") is formed on the front surface side of the well region 140 between the source region 170 and the drain region 171.

In an embodiment of the present disclosure, the terminal GND (corresponding to the first terminal) is to be electrically coupled to the semiconductor region 120 through the contact region 150, the terminal S (corresponding to the second terminal) is to be electrically coupled to the well region 140 through the contact region 160, and the body electrode 113 ("Bx") is also to be electrically coupled to the well region 140 through the contact region 161.

In such a semiconductor substrate 100, a diode 190 is formed as a parasitic diode between the p-type semiconductor region 120 and the n-type well region 130. In addition, a diode 191 is formed as a parasitic diode between the p-type well region 140 and the n$^+$-type source region 170.

Accordingly, for example, when the IGBT 31 is turned on and the voltage Vs drops below the voltage Vgnd ("0 V") resulting in a negative voltage, the source electrode 111 ("Sx") of the NMOS transistor 70 coupled to the terminal S also results in a negative voltage. As a result, the diodes 190, 191 are turned on, which causes the "leakage current" to flow from the terminal GND to the terminal S through a path indicated by the dashed-dotted line in FIG. 5.

When such a "leakage current" flows from the terminal GND to the terminal S, a current flowing to the signal output circuit 42, which is couple to the terminal GND and uses the voltage Vgnd as the ground voltage, illustrated in FIG. 1 for example, also increases. As a result, the power supply voltage Vreg significantly drops and the signal output circuit 42 may not operate normally.

Thus, in an embodiment of the present disclosure, the power supply circuit 40 is used to operate the signal output circuit 42 stably in the case where the voltage Vs becomes a negative voltage.

Note that the semiconductor region 120 according to an embodiment of the present disclosure corresponds to a "first region", and the well region 130 corresponds to a "second region". In addition, the well region 140 corresponds to a "third region", and the source region 170 corresponds to a "fourth region". In addition, the path of the "leakage current" has been described here using the NMOS transistor 70 as an example, however, other devices (for example, the NMOS transistor 72) of the drive circuit 45 also cause "leakage current" similarly.

<<<Example of Power Supply Circuit 40a>>>

Figure 6:
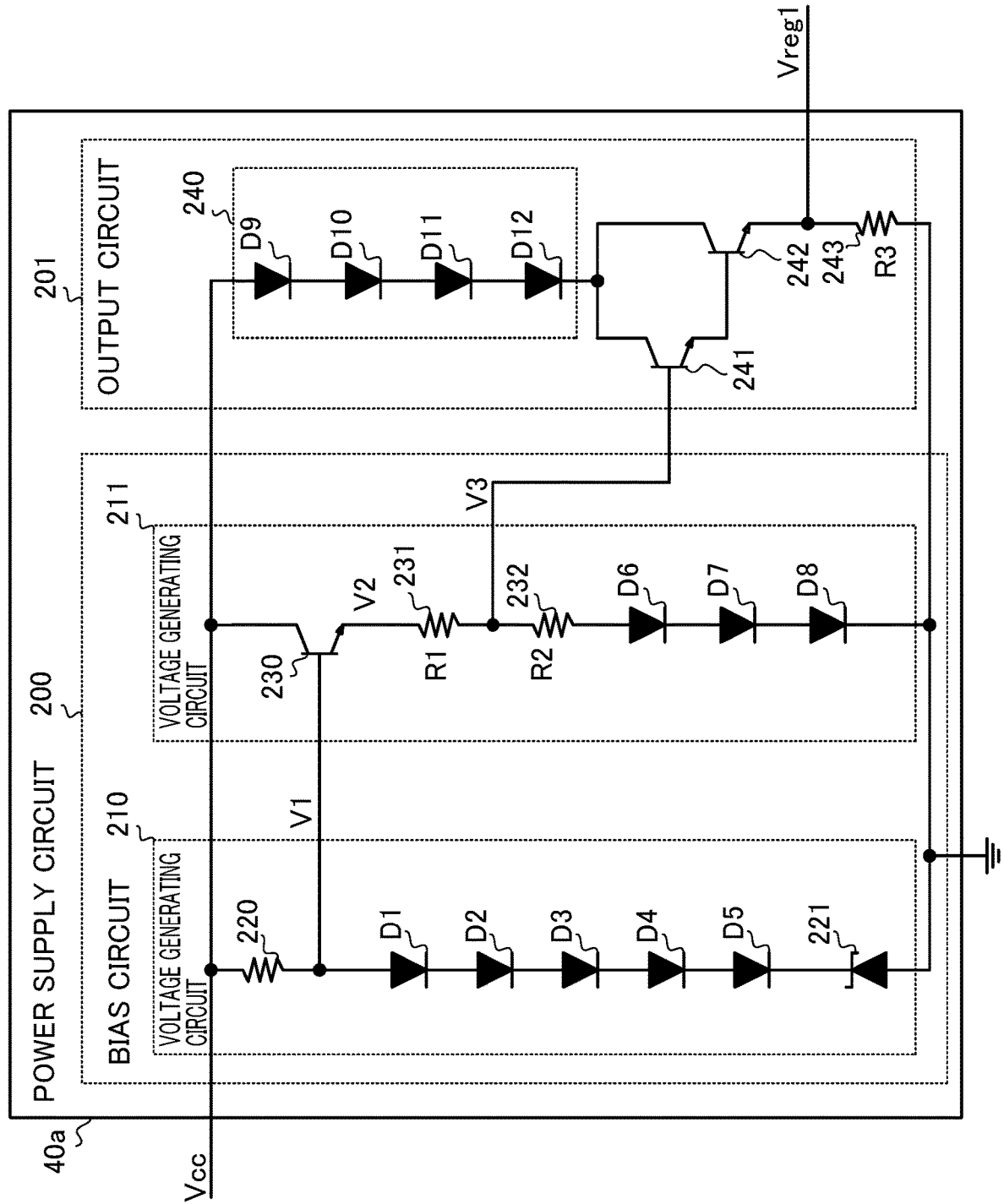

FIG. 6 is a diagram illustrating a power supply circuit 40a according to an embodiment of the configuration of the power supply circuit 40. The power supply circuit 40a generates a temperature-compensated power supply voltage Vreg1 (for example, "5 V") based on a power supply voltage Vcc. The power supply circuit 40a includes a bias circuit 200 and an output circuit 201.

The bias circuit 200 generates a bias voltage V3 for operating Darlington-coupled transistors (described later). The bias circuit 200 includes voltage generating circuits 210, 211.

The voltage generating circuit 210 generates a voltage V1 of a predetermined level, and includes a resistor 220, five diodes D1 to D5, and a Zener diode 221. Note that the voltage generating circuit 210 corresponds to a "first voltage generating circuit".

The resistor 220, the diodes D1 to D5, and the Zener diode 221 are coupled in series. Hence, when the power supply voltage Vcc is applied to one end of the resistor 220, the voltage V1 at the node at which the other end of the resistor 220 and the anode of the diode D1 are coupled is expressed by the following equation (1):

$$V1 = Vz + 5 \times Vf \quad (1)$$

where, "Vz" is the breakdown voltage of the Zener diode 221 and "Vf" is the forward voltage of the diodes D1 to D5.

The voltage generating circuit 211 generates a bias voltage V3 based on the voltage V1, and includes an NPN transistor 230, resistors 231, 232, and three diodes D6 to D8. Note that the voltage generating circuit 211 corresponds to a "second voltage generating circuit".

The NPN transistor 230 has a base electrode to which the voltage V1 is applied, and an emitter electrode to which diodes D6 to D8 are coupled through the resistors 231, 232. Accordingly, a voltage V2 expressed by the following equation (2) is outputted from the emitter electrode of the NPN transistor 230:

$$V2 = V1 - Vbe = Vz + 5 \times Vf - Vbe \quad (2)$$

where "Vbe" is the base-emitter voltage of the NPN transistor 230. In addition, in the voltage generating circuit 211, a voltage corresponding to the difference between the forward voltage "3×Vf" of the three diodes D6 to D8 and the voltage V2 is divided by a voltage divider circuit that is constituted by the resistors 231, 232. Hence, the bias voltage V3 from the node at which the resistors 231, 232 are coupled is expressed by the following equation (3).

$$V3 = 3 \times Vf + (V2 - 3 \times Vf) \times (R2/(R1+R2)) = 3 \times Vf + (Vz + 2 \times Vf - Vbe) \times (R2/(R1+R2)) \quad (3)$$

where "R1" is the resistance value of the resistor 231, and "R2" is the resistance value of the resistor 232.

The output circuit 201 outputs a predetermined power supply voltage Vreg1 based on the bias voltage V3, and includes a voltage protection circuit 240, NPN transistors 241, 242, and a resistor 243.

The voltage protection circuit 240 is a circuit for protecting the NPN transistors 241, 242 from overvoltage, and includes four diodes D9 to D12 coupled in series.

The emitter electrode of the NPN transistor 241 is coupled to the base electrode of the NPN transistor 242, and the collector electrode of the NPN transistor 241 is coupled to the collector electrode of the NPN transistor 242. Hence, the NPN transistors 241, 242 according to an embodiment of the present disclosure are Darlington-coupled, thereby being able to drive a larger load In addition, as described above, since the voltage V3 is applied to the base electrode of the NPN transistor 241 in the initial stage, a power supply voltage Vreg1 expressed by the following equation (4) is outputted from the emitter electrode of the NPN transistor 242.

$$Vreg1 = V3 - 2 \times Vbe = (3 \times Vf + (Vz + 2 \times Vf - Vbe) \times (R2/(R1+R2)) - 2 \times Vbe \quad (4)$$

The resistor 243 is an element for constantly generating the power supply voltage Vreg1. Specifically, in the case where the resistor 243 is not provided, when the power supply circuit 40a is under no load condition, a current flowing through the NPN transistors 241, 242 becomes zero. Accordingly, the generation of the power supply voltage Vreg1 is stopped.

Then, from such a condition, when a current flows to the load of the power supply circuit 40a, it takes time for the power supply circuit 40a to generate the power supply voltage Vreg1.

In an embodiment of the present disclosure, even when the power supply circuit 40a is under no load condition, a current continues to flow through the resistor 243. Accordingly, regardless of the load condition of the power supply circuit 40a, the power supply circuit 40a is able to constantly generate the predetermined power supply voltage Vreg1.

In addition, the temperature coefficient of the breakdown voltage "Vz" of the Zener diode 221 is positive, and the temperature coefficient of the forward voltage "Vf" of the diodes D1 to D12 is negative. The temperature coefficient of the base-emitter voltage "Vbe" is negative.

In addition, in an embodiment of the present disclosure, resistors of the same type having the same temperature coefficient (for example, of polysilicon) are used as the resistors 231, 232. Thus, the temperature coefficient in the term "R2/(R1+R2)" in the equation (4) is almost negligible.

In an embodiment of the present disclosure, for example, the number of the diodes D1 to D12 is adjusted based on the equation (4) so as to temperature-compensate the power supply voltage Vreg1. This causes the level of the power supply voltage Vreg1 to be constant regardless of the temperature. In addition, in an embodiment of the present disclosure, it is possible to cause the power supply voltage Vreg1 to achieve a desired level by changing the resistance ratio between the resistors 231 and 232.

As such, the power supply circuit 40a includes the Darlington-coupled NPN transistors 241, 242, and thus the power supply circuit 40a has a high output current capability. In addition, the power supply circuit 40a can output a temperature-compensated power supply voltage Vreg1 of a predetermined level (for example, "5 V").

<<<Example of Power Supply Circuit 40b>>>

Figure 7:
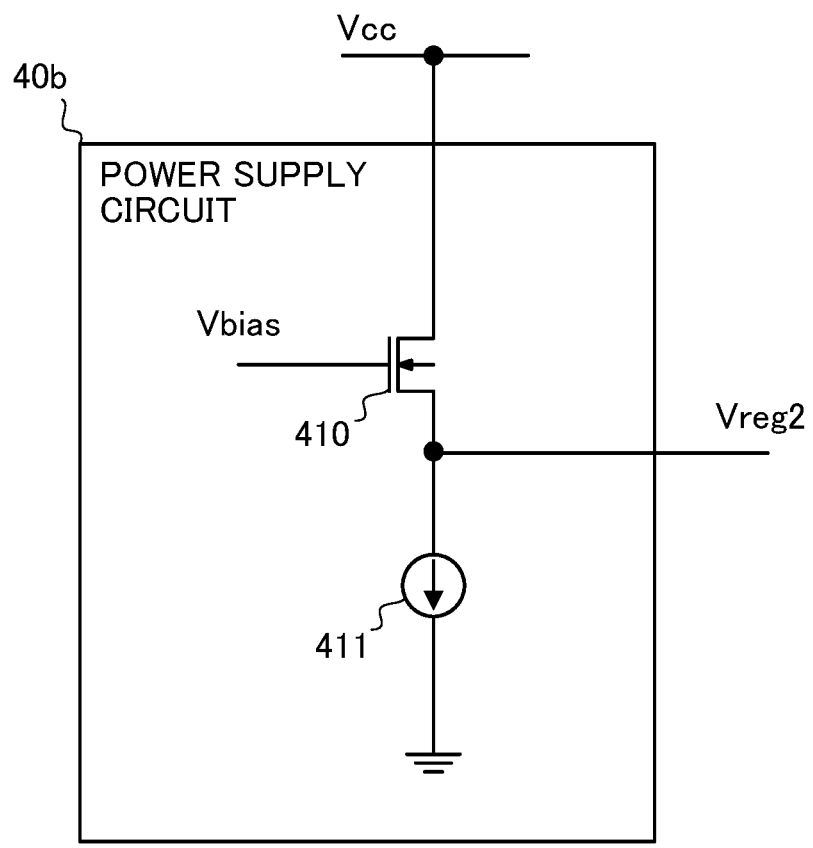
FIG. 7 is a diagram illustrating an example of a power supply circuit 40b.

FIG. 7 is a diagram illustrating an example of a power supply circuit 40b according to another embodiment of the configuration of the power supply circuit 40. Here, the power supply circuit 40b has an output current capability smaller than the output current capability of the power supply circuit 40a. The power supply circuit 40b includes an NMOS transistor 410 and a current source 411.

Since the NMOS transistor 410 and the current source 411 constitute a source follower, a power supply voltage Vreg2 according to a bias voltage Vbias, which is applied to the gate electrode of the NMOS transistor 410, is outputted from the source electrode of the NMOS transistor 410.

<<<Example of Waveform when IGBT 31 is On>>>

Figure 8:
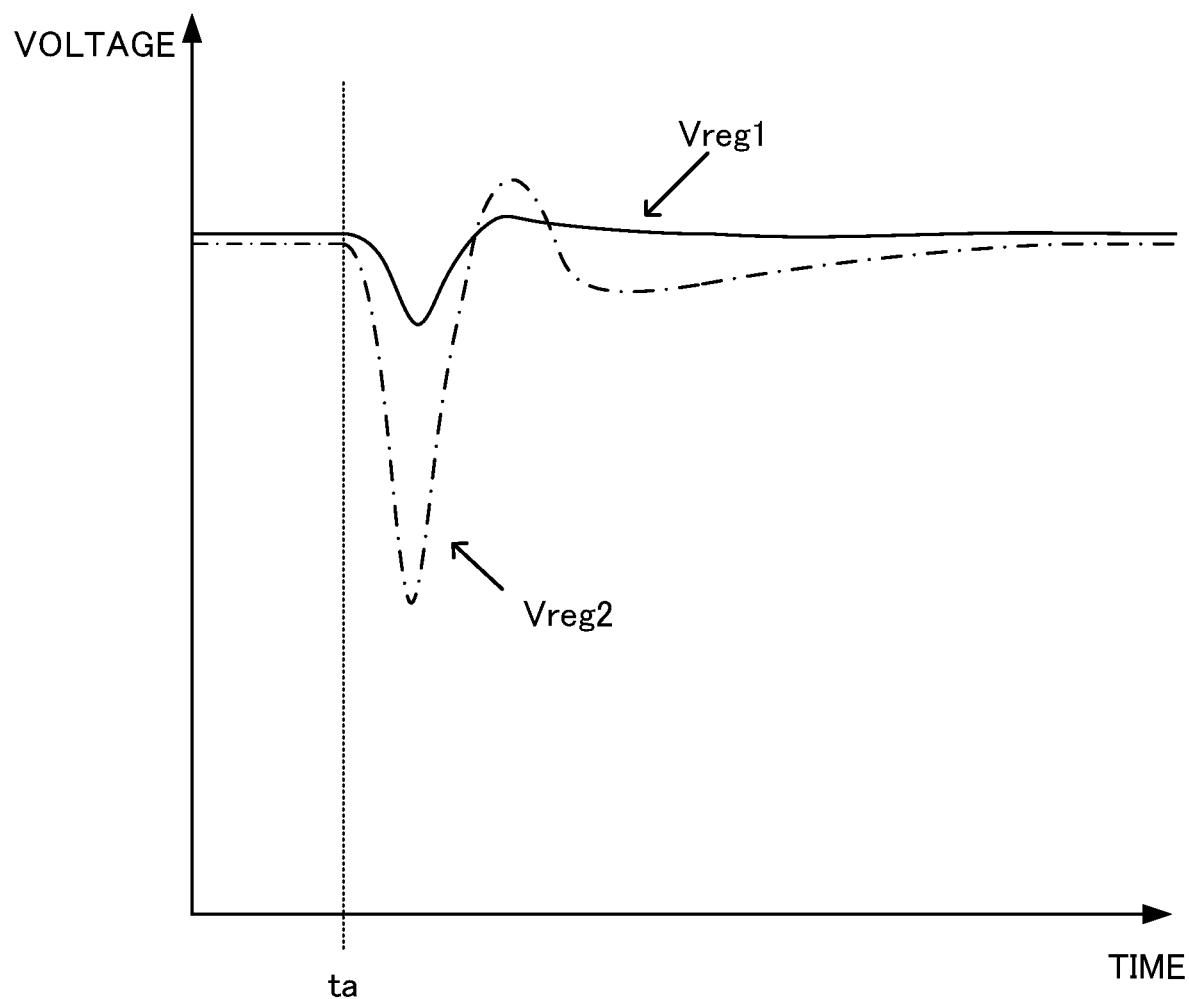

FIG. 8 is a diagram illustrating a result of comparison between the case where the power supply circuit 40a is used and the case where the power supply circuit 40b is used in the switching control IC 20.

<<Case where Power Supply Circuit 40a is Used>>

First, a change in the power supply voltage Vreg1 in the case where the switching control IC 20 uses the power supply circuit 40a will be described.

When the switching control IC 20 operates and the low-side IGBT 31 is turned on at time ta, for example, the voltage Vs becomes a negative voltage as described above. As a result, the "leakage current" flows from the terminal GND of FIG. 1 to the terminal S, and thus the current flowing to the signal output circuit 42 increases. However, as described above, the power supply circuit 40a includes the Darlington-coupled NPN transistors 241, 242. Hence, the power supply circuit 40a is able to output a large current while generating the power supply voltage Vreg1 of the target level.

As a result, the power supply circuit 40a can prevent the power supply voltage Vreg1 from significantly dropping, as indicated by the solid line in FIG. 8, and thus the operation of the switching control IC 20 can be stabilized.

<<Case where Power Supply Circuit 40b is Used>>

Next, a change in the power supply voltage Vreg2 in the case where the switching control IC 20 uses the power supply circuit 40b will be described. Here, it is assumed that the switching control IC 20 using the power supply circuit 40b operates and the low-side IGBT 31 is turned on at the timing of the foregoing time ta.

When the IGBT 31 is turned on, the "leakage current" flows from the terminal GND to the terminal S, and thus the current flowing to the signal output circuit 42 increases.

The power supply circuit 40b has a poor output stability as compared with the power supply circuit 40a. Accordingly, when the current flowing to the signal output circuit 42 increases, the power supply voltage Vreg2 of the power supply circuit 40b significantly drops as indicated by the dashed-dotted line in FIG. 8. Depending on the level of the power supply voltage Vreg2, the signal output circuit 42 malfunctions, and for example, outputs the set pulse signal S1 at a wrong timing.

Hence, in the switching control IC 20 where the voltage Vs becomes a negative voltage and the "leakage current" flows to the terminal S through the semiconductor region 120, it is preferable to use the power supply circuit 40a having a better output stability. The use of the power supply circuit 40a in the switching control IC 20 makes it possible to stabilize the operation of the switching control IC 20.

<<<Example of Power Supply Circuit 40c>>>

Figure 9:
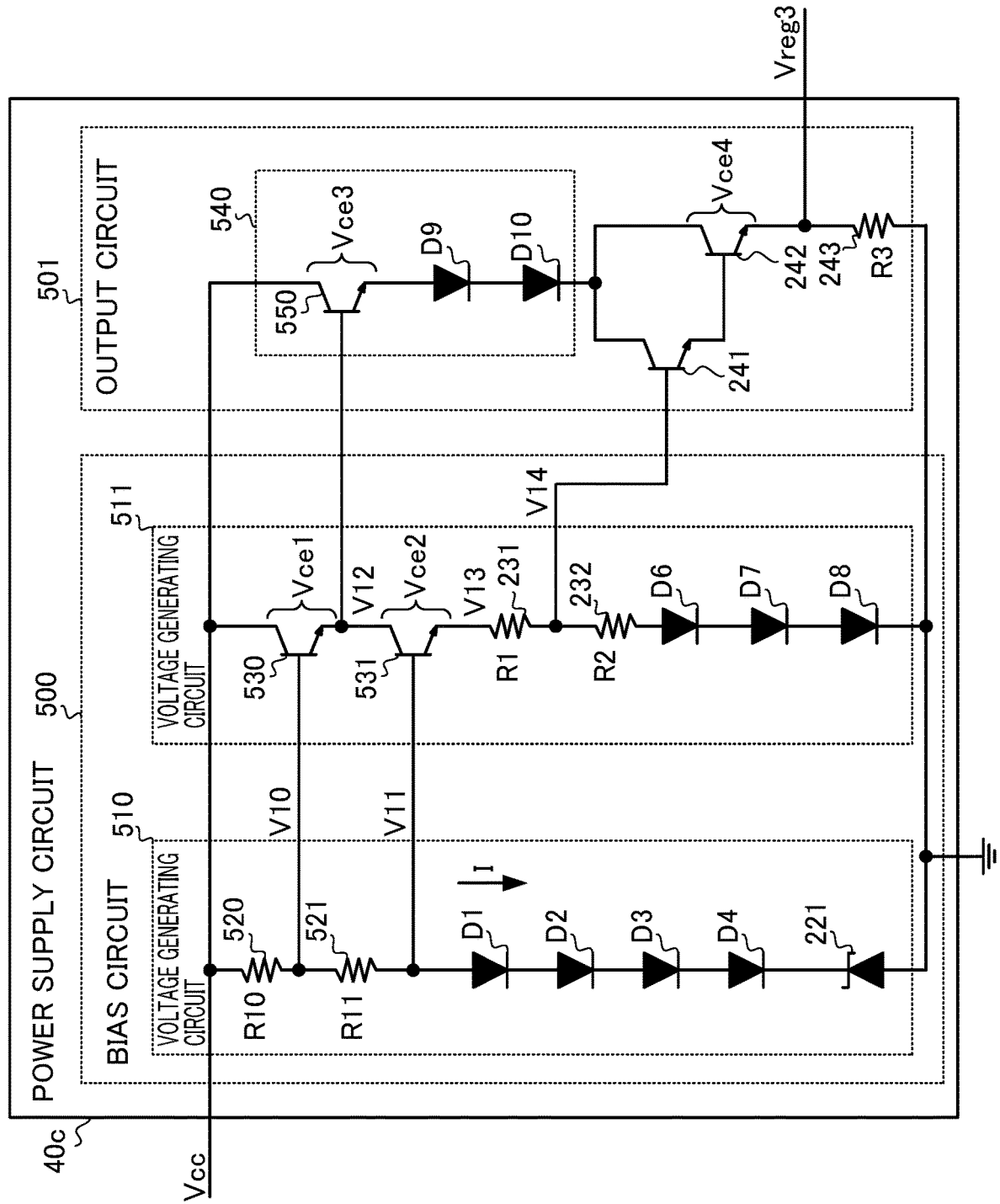
FIG. 9 is a diagram illustrating an example of a power supply circuit 40c.

FIG. 9 is a diagram illustrating a power supply circuit 40c according to an embodiment of the configuration of the power supply circuit 40. The power supply circuit 40c generates a temperature-compensated power supply voltage Vreg3 (for example, "5 V") based on a power supply voltage Vcc, as in the power supply circuit 40a. The power supply circuit 40c includes a bias circuit 500 and an output circuit 501. Note that the devices and elements given the same signs are the same between FIG. 6 and FIG. 9.

The bias circuit 500 outputs a voltage for operating the output circuit 501 including the Darlington-coupled NPN transistors 241, 242. The bias circuit 500 includes voltage generating circuits 510, 511.

The voltage generating circuit 510 generates voltages V10, V11 of predetermined levels, and includes resistors 520, 521, four diodes D1 to D4, and a Zener diode 221. Note that the voltage generating circuit 510 corresponds to a "first voltage generating circuit".

The resistors 520, 521, the diodes D1 to D4, and the Zener diode 221 are coupled in series. Hence, the current I flowing through the resistors 520, 521 when the power supply voltage Vcc is applied to one end of the resistor 520 is expressed by the following equation (5):

$$I=(Vcc-(Vz+4\times Vf))/(R10+R11) \quad (5)$$

where "R10" is the resistance value of the resistor 520 and "R11" is the resistance value of the resistor 521. Hence, the voltage V10 at the node at which the resistors 520, 521 are coupled is expressed by equation (6).

$$V10=Vcc-R10\times I \quad (6)$$

In addition, the voltage V11 at the node at which the resistor 521 and the diode D1 are coupled is expressed by equation (7).

$$V11=Vz+4\times Vf \quad (7)$$

Meanwhile, the voltage generating circuit 510 according to an embodiment of the present disclosure includes the four diodes D1 to D4, however, when the number of diodes increases, the level of the voltage V11 should exceed the level of the power supply voltage Vcc. Hence, in the voltage generating circuit 510, the number of diodes needs to be adjusted such that the level of the voltage V11 should be smaller than the level of the voltage Vcc.

The voltage generating circuit 511 generates voltages V12, V14 for operating the output circuit 501. The voltage generating circuit 511 includes NPN transistors 530, 531, resistors 231, 232, and three diodes D6 to D8. Note that the voltage generating circuit 511 corresponds to a "second voltage generating circuit".

The NPN transistor 530 has a base electrode to which the voltage V10 is applied and an emitter electrode to which the NPN transistor 531 is coupled. Thus, the NPN transistor 530 operates as an emitter follower. Hence, a voltage V12 expressed by the following equation (8) is outputted from the emitter electrode of the NPN transistor 530. Note that the base-emitter voltage of the NPN transistors 530, 531 is hereinafter given as "Vbe".

$$V12 = V10 - Vbe \quad (8)$$

In addition, the NPN transistor 531 has a base electrode to which the voltage V11 is applied and an emitter electrode to which the diodes D6 to D8 are coupled through the resistors 231, 232. Thus, the NPN transistor 531 also operates as an emitter follower. Accordingly, a voltage V13 expressed by the following equation (9) is outputted from the emitter electrode of the NPN transistor 531.

$$V13 = V11 - Vbe = Vz + 4 \times Vf - Vbe \quad (9)$$

In addition, in the voltage generating circuit 511, a voltage corresponding to a difference between the forward voltage "3×Vf" of the three diodes D6 to D8 and the voltage V13 is divided by a voltage divider circuit that is constituted by the resistors 231, 232. Hence, a bias voltage V14 from the node at which the resistors 231, 232 are coupled is expressed by the following equation (10).

$$V14 = 3 \times Vf + (V13 - 3 \times Vf) \times (R2/(R1+R2)) = 3 \times Vf + (Vz + Vf - Vbe) \times (R2/(R1+R2)) \quad (10)$$

Note that the NPN transistor 530 corresponds to a "second transistor" and the NPN transistor 531 corresponds to a "third transistor".

Meanwhile, the number of diodes of the voltage generating circuit 510 is four, however, when the number of diodes decreases, the voltages of the voltages V10, V11 drop. Consequently, a collector-emitter voltage Vce1 of the NPN transistor 530 and a collector-emitter voltage Vce2 of the NPN transistor 531 increase.

In view of this, the number of diodes (x) of the voltage generating circuit 510 needs to satisfy the following condition so that the voltages Vce1, Vce2 will not exceed their withstand voltages, respectively:

$$Vcc \le Vz + x \times Vf + (Vce1m + Vce2m) - Vbe \quad (11)$$

where, the voltages Vce1m, Vce2m are voltage values indicative of the withstand voltages of the respective voltages Vce1, Vce2, respectively.

The output circuit 501 outputs the predetermined power supply voltage Vreg3 based on the bias voltage V14, and includes a voltage protection circuit 540, NPN transistors 241, 242, and a resistor 243.

The voltage protection circuit 540 is a circuit for protecting the NPN transistors 241, 242 from overvoltage, and includes a NPN transistor 550 and two diodes D9, D10 coupled in series. The NPN transistor 550 has a base electrode to which the voltage V12 is applied and an emitter electrode to which the diodes D9, D10 are coupled. Thus, the NPN transistor 550 operates as an emitter follower. Note that the NPN transistor 550 corresponds to a "first transistor".

Since the configuration of the Darlington-coupled NPN transistors 241, 242 and the resistor 243 is the same as in FIG. 6, a large load can be driven. In addition, as described above, the voltage V14 is applied to the base electrode of the NPN transistor 241 in the initial stage, and thus the power supply voltage Vreg3 expressed by the following equation (12) is outputted from the emitter electrode of the NPN transistor 242.

$$Vreg3 = V14 - 2 \times Vbe = (3 \times Vf + (Vz + Vf - Vbe) \times (R2/(R1+R2))) - 2 \times Vbe \quad (12)$$

Note that since the resistor 243 is an element for constantly generating the power supply voltage Vreg3, the power supply circuit 40c is able to constantly generate the predetermined power supply voltage Vreg3, regardless of the load condition, as in the power supply circuit 40a.

In an embodiment of the present disclosure, for example, the number of the diodes D1 to D4, D6 to D8, is adjusted based on equation (12) so as to temperature-compensate the power supply voltage Vreg3. This causes the level of the power supply voltage Vreg3 to be constant regardless of the temperature. In addition, it is possible to cause the power supply voltage Vreg3 to achieve a desired level by changing the resistance ratio between the resistors 231, 232, for example.

As such, since the power supply circuit 40c includes the Darlington-coupled NPN transistors 241, 242, as in the power supply circuit 40a, the power supply circuit 40c has a high output current capability, and can output the temperature-compensated power supply voltage Vreg3 of predetermined level (for example, "5 V").

In addition, in an embodiment of the present disclosure, the following condition needs to be satisfied:

$$Vcc \le Vf \times y + Vce3m + Vce4m + Vreg3 \quad (13)$$

where a voltage Vce3m is the withstand voltage (i.e., breakdown voltage) between the emitter and collector of the NPN transistor 550, a voltage Vce4m is the breakdown voltage between the emitter and collector of the NPN transistor 242, and y is the number of diodes included in the voltage protection circuit 540.

As such, in an embodiment of the present disclosure, it is possible to appropriately protect the Darlington-coupled NPN transistors 241, 242 even when the level of the power supply voltage Vcc is high, by adjusting the number of diodes in the voltage protection circuit 540, for example.

CONCLUSION

The power module 10 according to an embodiment of the present disclosure has been described hereinabove. The power supply circuit 40a of the switching control IC 20 includes the two Darlington-coupled NPN transistors 241, 242. Thus, the switching control IC 20 can stably operate even in the case where the voltage Vs becomes a negative voltage.

In addition, the switching control IC 20 is formed in the semiconductor substrate 100 illustrated in FIG. 5, for example. In such a semiconductor substrate 100, when the voltage Vs becomes a negative voltage, the diodes 190, 191 are turned on, thereby generating the "leakage current". However, the power supply circuit 40a has a high output stability, even when the "leakage current" is generated and the current of the signal output circuit 42 increases, thereby being able to stably operate the signal output circuit 42.

In addition, the "leakage current" is generated through the NMOS transistor 70 of the high-side drive circuit 45, for example.

In addition, since the current corresponding to the power supply voltage Vreg1 flows through the resistor 243, the power supply circuit 40a can generate a power supply voltage Vreg1 that are constantly stable regardless of the load condition of the power supply circuit 40a.

In addition, the voltage protection circuit 240 is provided on the power supply side of the Darlington-coupled NPN transistors 241, 242. Thus, even when the power supply voltage Vcc is as high as "20 V", for example, low-voltage NPN transistors 241, 242 can be used.

In addition, the voltage protection circuit 240 includes the n (here, n=four) diodes D9 to D12. The use of a plurality of diodes coupled in series as such makes it possible to appropriately protect the NPN transistors 241, 242 from overvoltage.

In addition, the voltage protection circuit 540 includes the NPN transistor 550 coupled in series to the two diodes D9, D10. The use of a circuit having such a configuration makes it possible to appropriately protect the NPN transistors 241, 242 from overvoltage.

In addition, the bias circuit 200 applies the bias voltage V3 for temperature-compensating the power supply voltage Vreg1 to the base electrode of the NPN transistor 241. This makes it possible to enhance the temperature characteristics of the power supply voltage Vreg1.

In addition, in order to temperature-compensate the power supply voltage Vreg1, the bias circuit 200 includes the Zener diode 221 having a positive temperature coefficient and the m (here, m=five) diodes D1 to D5 having a negative temperature coefficient, for example.

In addition, since the voltage generating circuit 511 includes the NPN transistors 530, 531 coupled in series, the voltage generating circuit 511 can generate voltages V12, V14 of different levels. Here, the voltage V12 is a voltage for operating the NPN transistor 550 for protecting the Darlington-coupled transistors. In addition, the voltage V14 is a voltage for operating the NPN transistor 241 in the initial stage in the Darlington-coupled transistors in two stages.

In addition, the voltage generating circuit 211 can shift the level of the voltage V1 to the desired voltage V3 by using the NPN transistor 230, the i (here, i=three) diodes D6 to D8, and a "voltage divider resistor circuit" including the resistors 231, 232. Thus, in an embodiment of the present disclosure, it is possible to easily adjust the level of the power supply voltage Vreg1.

In addition, the voltage generating circuit 511 can adjust the level of the voltage V14 even when using a circuit including the NPN transistors 530, 531 coupled in series. Even when using such a circuit, the power supply circuit 40c can output the power supply voltage Vreg3 of a desired level.

In addition, in the switching control IC 20, the low-side drive circuit 44 controls the switching of the IGBT 31.

In addition, in an embodiment of the present disclosure, the Darlington-coupled transistors in two stages are the NPN transistors 241, 242, however, PNP transistors may also be used instead, for example. Note that even if including a configuration of Darlington-coupled transistors in three or more stages, for example, the power supply circuit 40a can achieve similar effects as in an embodiment of the present disclosure.

Embodiments of the present disclosure described above are simply for facilitating the understanding of the present disclosure and are not in any way to be construed as limiting the present disclosure. The present disclosure may variously be changed or altered without departing from its gist and encompass equivalents thereof.

What is claimed is:

1. A switching control circuit for a semiconductor device having
   a first switching device on a power supply side thereof, and
   a second switching device on a ground side thereof, the second switching device driving a load of the semiconductor device in cooperation with the first switching device,
the switching control circuit controlling switching of the first and second switching devices, and comprising:
   a signal output circuit that outputs a set signal for turning on the first switching device and a reset signal for turning off the first switching device, in response to an input signal of the switching control circuit;
   a level shift circuit that shifts a level of each of the set signal and the reset signal;
   a first drive circuit that drives the first switching device in response to an output from the level shift circuit; and
   a power supply circuit including a plurality of transistors that are Darlington-coupled, the plurality of Darlington-coupled transistors being configured to generate a power supply voltage for the signal output circuit.

2. The switching control circuit according to claim 1, wherein
   the switching control circuit is an integrated circuit formed in a semiconductor substrate, the semiconductor substrate including at least
      a p-type first region,
      an n-type second region formed in the p-type first region,
      a p-type third region formed in the n-type second region, and
      an n-type fourth region formed in the p-type third region; and
   the switching control circuit further includes
      a first terminal to be applied with a voltage of a reference of the signal output circuit, the first terminal electrically coupled to the p-type first region, and
      a second terminal to be applied with a voltage of a reference of the first drive circuit, the second terminal electrically coupled to the n-type fourth region, the second terminal coupled to the first switching device and the second switching device.

3. The switching control circuit according to claim 2, wherein
   the first drive circuit includes an n-type metal-oxide-semiconductor (NMOS) transistor formed in the p-type third region, the NMOS transistor having a source electrode that is electrically coupled to the n-type fourth region.

4. The switching control circuit according to claim 1, wherein
   the power supply circuit includes a resistor between a ground and one of the plurality of Darlington-coupled transistors at which the power supply voltage is outputted.

5. The switching control circuit according to claim 1, wherein
   the power supply circuit includes a voltage protection circuit that protects the plurality of Darlington-coupled transistors from overvoltage.

6. The switching control circuit according to claim 5, wherein
   the voltage protection circuit includes a plurality of diodes coupled in series.

7. The switching control circuit according to claim 6, wherein
the voltage protection circuit includes a first transistor coupled in series to the plurality of diodes.

8. The switching control circuit according to claim 7, wherein
the plurality of Darlington-coupled transistors are arranged in a plurality of stages including an initial stage; and
the power supply circuit includes a bias circuit that applies a bias voltage for temperature-compensating the power supply voltage to a base electrode of one of the plurality of Darlington-coupled transistors in the initial stage.

9. The switching control circuit according to claim 8, wherein
the plurality of diodes is a first plurality of diodes; and
the bias circuit includes:
a first voltage generating circuit that includes a Zener diode and a second plurality of diodes coupled in series to the Zener diode, the first voltage generating circuit being configured to generate a voltage of a predetermined level; and
a second voltage generating circuit that applies the bias voltage to the base electrode of the one Darlington-coupled transistor in the initial stage based on the voltage of the predetermined level.

10. The switching control circuit according to claim 9, wherein the second voltage generating circuit includes:
a second transistor that outputs a voltage for operating the first transistor; and
a third transistor, which is provided closer to the ground side of the switching control circuit than the second transistor, and is configured to output a voltage for operating the one Darlington-coupled transistor in the initial stage.

11. The switching control circuit according to claim 9, wherein
the second voltage generating circuit includes a voltage divider resistor circuit that includes a third plurality of diodes, and that generates, as the bias voltage, a voltage corresponding to a difference between the voltage of the predetermined level and a forward voltage of the third plurality of diodes.

12. The switching control circuit according to claim 1, wherein
the plurality of Darlington-coupled transistors are arranged in a plurality of stages including an initial stage; and
the power supply circuit includes a bias circuit that applies a bias voltage for temperature-compensating the power supply voltage to a base electrode of one of the plurality of Darlington-coupled transistors in the initial stage.

13. The switching control circuit according to claim 12, wherein the bias circuit includes a first voltage generating circuit that includes a Zener diode and a plurality of diodes coupled in series to the Zener diode, the first voltage generating circuit being configured to generate a voltage of a predetermined level; and
a second voltage generating circuit that applies the bias voltage to the base electrode of the one Darlington-coupled transistor in the initial stage, based on the voltage of the predetermined level.

14. The switching control circuit according to claim 13, wherein
the plurality of diodes included in the first voltage generating circuit is a first plurality of diodes, and
the second voltage generating circuit includes a voltage divider resistor circuit that includes a second plurality of diodes, and that generates, as the bias voltage, a voltage corresponding to a difference between the voltage of the predetermined level and a forward voltage of the second plurality of diodes.

15. The switching control circuit according to claim 1, further comprising:
a second drive circuit that drives the second switching device in response to a control signal for controlling the switching of the second switching device, wherein
the signal output circuit outputs the control signal in response to the input signal.

16. The switching control circuit according to claim 1, wherein
each of the plurality of Darlington-coupled transistors is an NPN transistor.

17. A semiconductor device having a load, comprising:
a first switching device on a power supply side of the semiconductor device;
a second switching device on a ground side of the semiconductor device, the second switching device driving the load of the semiconductor device in cooperation with the first switching device; and
a switching control circuit that controls switching of the first and second switching devices, the switching control circuit including:
a signal output circuit that outputs a set signal for turning on the first switching device and a reset signal for turning off the first switching device, in response to an input signal of the semiconductor device;
a level shift circuit that shifts a level of each of the set signal and the reset signal;
a drive circuit that drives the first switching device in response to an output from the level shift circuit; and
a power supply circuit including a plurality of transistors that are Darlington-coupled, the plurality of Darlington-coupled transistors being configured to generate a power supply voltage for the signal output circuit.

* * * * *